(12) United States Patent
Kahlisch et al.

(10) Patent No.: US 6,979,887 B2
(45) Date of Patent: Dec. 27, 2005

(54) SUPPORT MATRIX WITH BONDING CHANNEL FOR INTEGRATED SEMICONDUCTORS, AND METHOD FOR PRODUCING IT

(75) Inventors: Knut Kahlisch, Dresden (DE); Henning Mieth, Jahnsdorf (DE)

(73) Assignee: Infineon Technologies AG, Munich (DE)

( * ) Notice: Subject to any disclaimer, the term of this patent is extended or adjusted under 35 U.S.C. 154(b) by 639 days.

(21) Appl. No.: 09/901,550

(22) Filed: Jul. 9, 2001

(65) Prior Publication Data
US 2002/0003295 A1 Jan. 10, 2002

(30) Foreign Application Priority Data
Jul. 7, 2000 (DE) ............... 100 34 006

(51) Int. Cl.⁷ .......................................... H01L 23/495
(52) U.S. Cl. .............. 257/667; 257/691; 257/668; 257/778; 257/784; 257/692; 257/650
(58) Field of Search ................ 257/691, 667, 257/668, 778, 784, 692, 680, 650

(56) References Cited

U.S. PATENT DOCUMENTS

| | | | | |
|---|---|---|---|---|
| 4,562,092 A | * | 12/1985 | Wiech, Jr. ................ | 427/58 |
| 4,599,636 A | * | 7/1986 | Roberts et al. ........... | 257/665 |
| 5,866,949 A | | 2/1999 | Schueller ................. | 257/778 |
| 6,013,946 A | | 1/2000 | Lee et al. ................ | 257/684 |
| 6,252,298 B1 | * | 6/2001 | Lee et al. ................ | 257/668 |

FOREIGN PATENT DOCUMENTS

| | | |
|---|---|---|
| EP | 0 472 766 A 1 | 3/1992 |
| JP | 01217952 A | 8/1989 |
| JP | 06 085 111 | 3/1994 |
| JP | 07038044 A * | 2/1995 |
| JP | 08 186 191 | 7/1996 |
| JP | 08 293 626 | 11/1996 |
| JP | 10214924 A | 8/1998 |
| JP | 11 008 275 | 1/1999 |
| JP | 11 017 048 | 1/1999 |
| JP | 2000-183269 A * | 10/2000 |

* cited by examiner

Primary Examiner—George Eckert
Assistant Examiner—Chris C. Chu
(74) Attorney, Agent, or Firm—Laurence A. Greenberg; Werner H. Stemer; Ralph E. Locher

(57) ABSTRACT

Support matrices for semiconductors are often encapsulated in a region of the bonding leads, the so-called bonding channel. The encapsulation is effected using a dispensable material that can flow onto the support matrix and causes contamination there. In order to prevent this flow, the support matrix for integrated semiconductors has a frame, conductor track structures and at least one bonding channel. In the bonding channel bonding leads or wires for connecting the conductor track structures to the integrated semiconductor are disposed. Disposed along the edge of the bonding channel a barrier for preventing the flow of flowable material from the bonding channel onto the frame and/or the conductor track structures. A method for producing such support matrices is likewise disclosed.

8 Claims, 2 Drawing Sheets

FIG.1
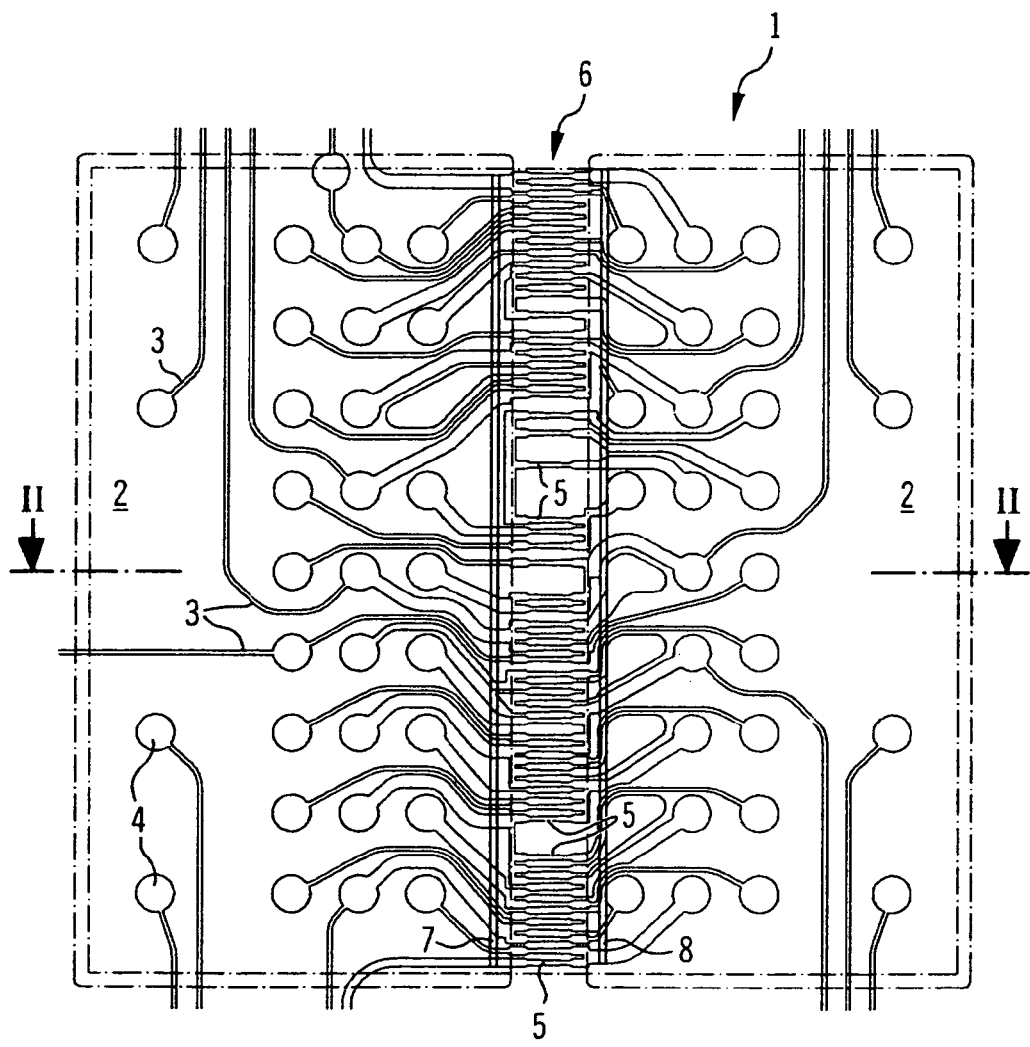
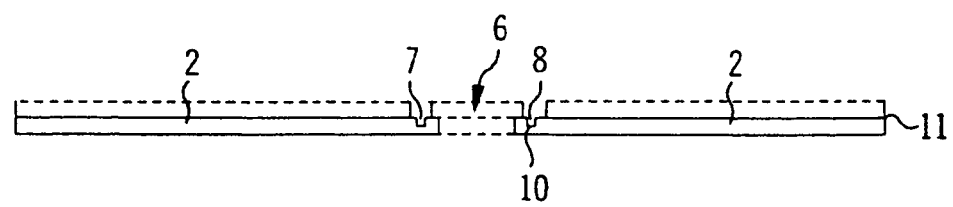
FIG. 2

US 6,979,887 B2

SUPPORT MATRIX WITH BONDING CHANNEL FOR INTEGRATED SEMICONDUCTORS, AND METHOD FOR PRODUCING IT

BACKGROUND OF THE INVENTION

FIELD OF THE INVENTION

The invention relates to a support matrix with a bonding channel for integrated semiconductors having a barrier at the bonding channel, and to a method for producing such a support matrix.

Modern miniature housings for integrated semiconductors such as $\mu$BGA, FBGA, etc. contain a support matrix in addition to the actual encapsulation and the silicon chip. The support matrix serves for stabilization and electrical connection of the contact pads of the semiconductor chip to the external contacts of the housing. For this purpose, the support matrix has a frame, for example a suitably shaped polyimide film having a thickness of 50 $\mu$m, for example, and also a conductor track structure which connects the contact pads to one another. Usually, the semiconductor chip is connected to one side of the support matrix, while contacts for externally connecting the housing on a circuit board or the like are disposed on the other side of the support matrix. The conductor track structure is usually disposed on that side of the frame on which the semiconductor chip is also located, while the external contacts are located on the other side. The connection between the conductor track structures and the external contacts is achieved through holes in the frame.

The actual connection between conductor track structures and the semiconductor chip is effected by so-called bonding leads, that is to say tongue-like regions on the conductor track structure which are bent or can be bent toward the semiconductor chip in order to make contact with the contact pads of the semiconductor chip, or by gold wires. The bonding leads are then bonded to the semiconductor, for example by welding, microwelding methods or soldering.

In a customary procedure, the bonding leads are concentrated in a so-called bonding channel. The bonding channel is an opening in the frame that allows access to the bonding leads or the wiring from the side remote from the semiconductor chip. During the mounting of the support matrix onto the semiconductor chip, from that side of the support matrix which is remote from the semiconductor chip, the bonding leads are pressed by bonding punches toward the semiconductor chip and bonded there or gold wires are bonded from the conductor track structure to the semiconductor.

The bonding leads are connected to the remainder of the conductor track structures via a so-called anchor. On the side opposite to the anchor there is often a mating anchor that is connected to the actual bonding region of the bonding lead via a desired breaking point. When the bonding region is pressed onto the contact point of the semiconductor chip, the desired breaking point tears.

In order to stabilize the connection between the support matrix and the semiconductor chip, the bonding channels are filled with a suitable material.

The filling material is for the most part a dispensable material of low viscosity. There is thus the risk that this material will contaminate areas of the support matrix that must remain absolutely clean for subsequent process steps during the production of the chip.

Hitherto, in a time-consuming and costly method, inter alia in a multistage dispensing method, the so-called Dam & Fill, a plurality of materials of different viscosity have been applied in such a way that the material of low viscosity has been prevented from escaping by use of a frame. However, a reliable area adjacent to the bonding channel and protected from contaminants could not be achieved in this way in all cases. In particular, a dispensed frame cannot be realized in the case of closely adjoining, active zones.

SUMMARY OF THE INVENTION

It is accordingly an object of the invention to provide a support matrix with a bonding channel for integrated semiconductors, and a method for producing it which overcome the above-mentioned disadvantages of the prior art methods and devices of this general type, which can reliably prevent creepage of a flowable material from the bonding channel.

With the foregoing and other objects in view there is provided, in accordance with the invention, a support matrix for integrated semiconductors. The matrix contains a frame having at least one bonding channel with an edge formed therein. The frame further has a groove formed therein along the edge of the bonding channel. Conductor track structures are disposed on the frame. The groove formed in the frame functions as a barrier for preventing a flow of a flowable material from the bonding channel onto the frame and onto the conductor track structures. Contacts, being bonding leads or wires, are connected to the conductor track structures and are disposed in the bonding channel. The contacts are used for connecting the conductor track structures to an integrated circuit.

The invention is first directed at the support matrix for integrated semiconductors having the frame, the conductor track structures and at least one bonding channel, in which bonding leads or wires for connecting the conductor track structures to the integrated semiconductor are disposed. There is disposed at the edge of the bonding channel a barrier for preventing the flow of the flowable material from the bonding channel onto the frame and/or the conductor track structures.

Consequently, the inventive basic concept is that, instead of implementing costly cleaning or sealing measures, the barrier disposed at the edge of the bonding channel is used to prevent creepage of the material used into the region to be protected.

The barrier represents a parting line for the flowable material between the conductor tracks and the frame, on the one hand, and the bonding channel, on the other hand. The barrier is expediently oriented in such a way that it leads around the entire bonding channel transversely with respect to the possible flow direction of the silicone material. At the very least, it is preferred for the sides of the bonding channel which lie next to particularly sensitive regions of the support matrix to be provided with the barrier according to the invention.

Preferably, the barrier is disposed on all sides of the bonding channel and completely surrounds the latter.

The barrier can be disposed differently depending on the planned function. Thus, the barrier can be disposed on the frame and/or on the bonding leads and/or on the conductor track structures. The exact configuration of the barrier is dependent on the desired purpose of use and the conditions given at the location of the barrier. It may be disposed nearer to the edge of the bonding channel and, for example, be lead over anchor regions of the bonding leads; or be further away from it and then led over conductor tracks and the actual frame. In regions which are completely covered by the conductor track structures, the barrier will, if appropriate, be led only over the latter, while the barrier in a region of the support matrix without conductor tracks might be led only over the frame.

The barrier may also be disposed on that surface of the frame which is remote from the bonding leads. This enables protection of that side of the support matrix which is remote from the semiconductor chip, for example in order to avoid contamination of the external contact pads. It is also possible to dispose barriers on both sides of the support matrix, which may be above one another or else laterally offset with respect to one another in order, for example in the case of thin support matrices, to enable the barrier to have a sufficient depth if it is in the form of a groove.

The flowable material may be, for example, silicone for forming structures on the support matrix.

Various possibilities are available for the configuration of the barrier. Thus, the barrier may have a groove or a wall. When the groove is used, the edge effect for flow and adhesion of the flowable material is exploited, in which a flowable material is unable to flow around an edge directed downward. In this way, the groove can constitute an effective barrier for liquids. The use of a wall, that is to say projecting barrier element, can also have a limiting effect that is dependent on the adhesion properties of the flowable material on the respective substrate.

Finally, the barrier may have a region with a parting agent which repels the flowable material. In this case, then, the adhesiveness of the flowable material on the substrate is altered by the use of a coating in such a way that it is unable to creep over the coated region onto the region to be protected.

It is possible to combine different types of the barriers discussed above with one another or to dispose a plurality of identical barriers one after the other on the bonding lead. Such measures can further improve the retaining effect of the barrier according to the invention, although with increased outlay.

Furthermore, the invention is directed at a method for producing a support matrix for integrated semiconductors having a frame, conductor track structures and at least one bonding channel in which bonding leads for connecting the conductor track structures to the integrated semiconductor are disposed. At least one groove is incorporated at the edge of the bonding channel for preventing the flow of flowable material from the bonding channel onto the frame and/or the conductor track structures.

In this case, the method according to the invention can preferably be effected photochemically and have the following steps of applying a resist mask; and etching of transverse grooves into the anchor of the bonding lead.

The resist mask is applied e.g. in a manner familiar to the person skilled in the art by coating with a photoresist, exposure of the desired pattern and development of the resist layer.

As an alternative, the method may have the following step of embossing transverse grooves into an anchor of the bonding lead. In order to reinforce the barrier effect, it may be preferred for a plurality of barriers running parallel to be connected one after the other.

The etching depth or embossing depth should be dimensioned such that, on the one hand, an overflow is prevented and, on the other hand, an additional area requirement does not become necessary.

Finally, the invention is directed at a method for producing a support matrix for integrated semiconductors having a frame, conductor track structures and at least one bonding channel, in which bonding leads for connecting the conductor track structures to the integrated semiconductor are disposed. At least one wall is applied at the edge of the bonding channel for preventing the flow of flowable material from the bonding channel onto the frame and/or the conductor track structures.

The application of the material can be achieved using customary methods for producing semiconductors, such as, for example, coating methods with plasma deposition.

The barriers can be produced during the integrated production of the conductor track structures and bonding leads and before their connection to the frame of the support matrix. As an alternative, it is also possible to provide the barriers after the connection of frame and conductor track structure/bonding lead layer.

Other features which are considered as characteristic for the invention are set forth in the appended claims.

Although the invention is illustrated and described herein as embodied in a support matrix with a bonding channel for integrated semiconductors, and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of a region of a support matrix according to the invention;

FIG. 2 is a sectional view taken along the line II—II shown in FIG. 1;

DESCRIPTION OF THE PREFERRED EMBODIMENTS

Figure 3:
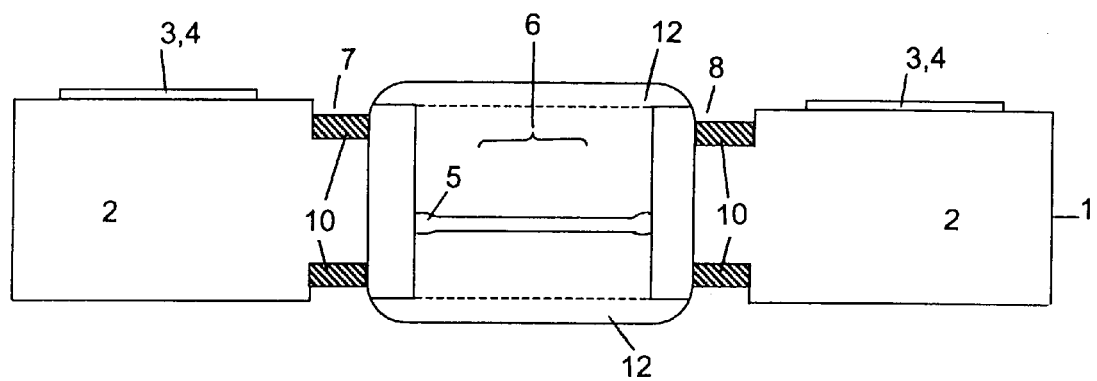
FIG. 3 is a diagrammatic, enlarged sectional view similar to FIG. 2.
Figure 4:
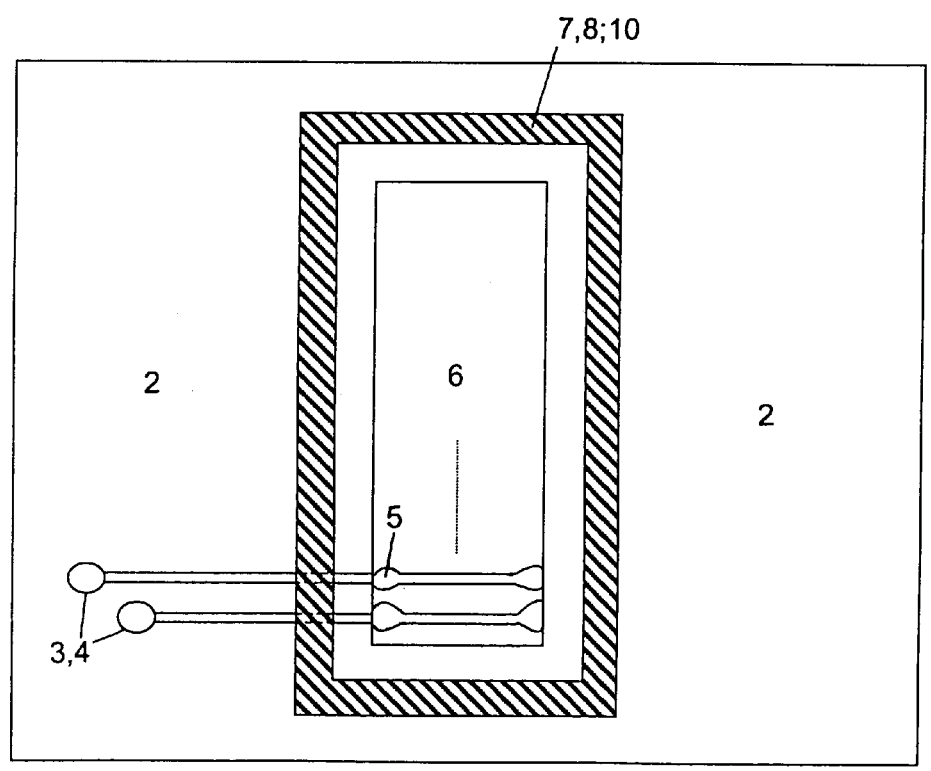
FIG. 4 is a diagrammatic, partial plan view of the support matrix, showing the groove formed surrounding the bonding channel and extending toward the bonding leads.

In all the figures of the drawing, sub-features and integral parts that correspond to one another bear the same reference symbol in each case. Referring now to the figures of the drawing in detail and first, particularly, to FIG. 1 thereof, there is shown, in plan view, a region of a support matrix 1 as an exemplary embodiment of the present invention. Conductor track structures are formed on a frame 2, the conductor track structures contain conductor tracks 3 and external contact pads 4 for contact-connecting a housing to circuits, for example on circuit boards. Bonding leads 5 are concentrated in a bonding channel 6. They contain an anchor, a mating anchor and a central, actual bonding region for connecting a bonding lead 5 to the semiconductor chip.

Barriers 7, 8 according to the invention are disposed along the bonding channel 6 at its edge. As is evident from FIG. 2, they run over the entire long side of the bonding channel 6 illustrated and hence over the conductor track structures 3 and the actual frame 2.

FIG. 2 is a cross section through the support matrix of FIG. 1 along the section line II—II. The barriers 7 and 8 running along the edge of the bonding channel 6 are shown as grooves 7, 8 here. It goes without saying, however, that they can likewise be a different embodiment of the present invention.

The barrier 7, 8 may have a region with a parting agent 10 disposed thereon which repels the flowable material. In this case, then, an adhesiveness of the flowable material on the frame is altered by the use of the coating 10 in such a way that it is unable to creep over the coated region onto the region to be protected.

One method of forming the grooves 7, 8, requires the application of a resist mask 11 over the frame 2 and then a latter etching process for forming the grooves 7, 8. Another method of forming the grooves 7, 8 is to emboss them in at least one of the frame 2, the conductor track structures 3, and the bonding leads 5.

As shown in FIG. 3, the parting agent 10 is disposed in the groove 7, 8 for preventing the flow of the flowable material 12, such as silicone, which forms structures on the supporting matrix 1.

We claim:

1. A support matrix for integrated semiconductors, comprising:
   a frame having at least one bonding channel with an edge formed therein, said frame further having a groove formed therein along said edge of said bonding channel;
   conductor track structures disposed on said frame, said groove formed in said frame functioning as a barrier for preventing a flow of a flowable material from said bonding channel onto said frame and onto said conductor track structures, said barrier having a region with a parting agent disposed thereon for repelling the flowable material; and
   contacts, selected from the group consisting of bonding leads and wires, connected to said conductor track structures and disposed in said bonding channel, said contacts used for connecting said conductor track structures to an integrated circuit.

2. The support matrix according to claim 1, wherein said barrier is disposed on all sides of said bonding channel and completely surrounds said bonding channel.

3. The support matrix according to claim 1, wherein said frame has a surface remote from said bonding leads and said barrier is formed in said surface of said frame which is remote from said bonding leads.

4. The support matrix according to claim 1, wherein the flowable material is silicone for forming structures on the support matrix.

5. The support matrix according to claim 1, wherein said barrier has a region with a parting agent disposed thereon for repelling the flowable material.

6. A support matrix for integrated semiconductors, comprising:
   a frame having at least one bonding channel with an edge formed therein;
   conductor track structures disposed on said frame, said frame and said conductor track structures having a groove formed therein along said edge of said bonding channel, said groove functioning as a barrier for preventing a flow of a flowable material from said bonding channel onto said frame and onto said conductor track structures, said barrier having a region with a parting agent disposed thereon for repelling the flowable material; and
   contacts, selected from the group consisting of bonding leads and wires, connected to said conductor track structures and disposed in said bonding channel, said contacts used for connecting said conductor track structures to an integrated circuit.

7. The support matrix according to claim 6, wherein said groove is formed to extend into said bonding leads.

8. A support matrix for integrated semiconductors, comprising:
   a frame having at least one bonding channel with an edge formed therein;
   conductor track structures disposed on said frame;
   contacts, selected from the group consisting of bonding leads and wires, connected to said conductor track structures and disposed in said bonding channel, said contacts used for connecting said conductor track structures to an integrated circuit; and
   a barrier formed along said edge, said barrier having a parting agent disposed thereon for repelling a flowable material from said bonding channel onto said frame and onto said conductor track structures.

* * * * *